United States Patent [19]

Butts

[11] Patent Number: 4,803,362

[45] Date of Patent: Feb. 7, 1989

[54] ELECTRO-OPTICALLY ACTIVATED SWITCH WITH TACTILE FEEDBACK

[75] Inventor: Gary C. Butts, Huntington Beach, Calif.

[73] Assignee: Labworks, Inc., Costa Mesa, Calif.

[21] Appl. No.: 113,638

[22] Filed: Oct. 27, 1987

[51] Int. Cl.⁴ .............................................. G01D 5/34
[52] U.S. Cl. .................................................. 250/229
[58] Field of Search ..................... 250/229; 340/365 P

[56] References Cited

U.S. PATENT DOCUMENTS

| | | | |
|---|---|---|---|
| 4,196,348 | 4/1980 | Iwakiri et al. | 350/229 |
| 4,247,211 | 1/1981 | Behrendt et al. | 340/365 P X |
| 4,292,517 | 9/1981 | Nelson | 250/229 |
| 4,466,302 | 8/1984 | Harris | 250/229 X |

*Primary Examiner*—Vincent P. McGraw
*Attorney, Agent, or Firm*—Blakely, Sokoloff, Taylor & Zafman

[57] ABSTRACT

An optical switch for use as a modular keyboard switch designed to provide tactile and audible feedback to the keyboard operator. The switch includes an opaque housing in which a light emitting device and a light activated detector are mounted. A "U" shaped spring shutter rests within the housing between the emitter and detector and has an aperture through which light from the emitter may illuminate the detector. A spring loaded key stem moves longitudinally within the housing and is designed to penetrate the open end of the shutter. The key stem and shutter are shaped such that as the key stem is depressed the upwardly extending arms of the shutter are at first forced outward by projecting shoulders on the key stem and then snap back along upwardly sloping surfaces of the shoulder, thereby causing the shutter to spring upwards and block the optical path between the emitter and detector. The snap action of the shutter causes an audible "click" and also provides tactile feedback to the operator.

21 Claims, 3 Drawing Sheets

ELECTRO-OPTICALLY ACTIVATED SWITCH WITH TACTILE FEEDBACK

BACKGROUND OF THE INVENTION

1. FIELD OF THE INVENTION

The present invention relates to electrical switches, and more particularly, to optical switches for use in keyboard applications.

2. BACKGROUND ART

Switches for keyboard applications typically rely upon an electrical coupling of metallic contacts to provide the desired switching action. Such contacts are prone to corrosion, dirt buildup, and metal fatigue. Consequently, the service life of switches employing such contacts is limited.

The term "optical switch" is commonly applied to a switch that includes an emitter of electromagnetic radiation, typically a light emitting diode (LED), and a photo-detector that is sensitive to the emitted radiation. The output of the detector is coupled to an electronic switch within an electrical circuit. The optical path between the emitter and detector may be selectively interrupted, thereby closing or opening the electrical circuit. Such switches do not suffer the drawbacks of mechanical electrical contacts. However, such optical switches typically do not provide a user with the tactile and audible feedback that has been found desirable for switches used in keyboard applications.

It has been known to adapt switches with mechanical contacts to enhance the tactile and audible feedback provided to the keyboard operator. For example, U.S. Pat. No. 4,341,934 entitled "Actuator for Keyboard Switches" issued July 27, 1982 to Muller and U.S. Pat. No. 4,525,613 entitled "Spiral Spring Keyboard Switch with Hairpin Spring Tactile Feedback" issued June 25, 1985 to Butts both describe switches specifically designed to provide positive user feedback. Both of the above-referenced patents, however, employ mechanical contacts for accomplishing the switching action.

As will be subsequently described, the present invention comprises an inherently reliable optical switch that also provides a positive tactile feel and an audible click to the user.

SUMMARY OF THE INVENTION

An optical switch having unique tactile and audible feedback is disclosed. The switch includes a housing in which an emitter and detector are disposed at respective ends of an optical path. A stainless steel spring shutter resides within the housing between the emitter and detector. An aperature in the shutter permits energy transmitted by the emitter to be received by the detector when the shutter is in a first position. In a second position, the shutter completely blocks the optical path between the emitter and detector.

A user actuates the invention by means of a spring loaded key stem which is slideably mounted in the housing for longitudinal movement. A lower portion of the key stem has two laterally opposed triangular shoulders which engage an upper portion of the shutter. As the key stem is depressed by a user, spring arms of the shutter are forced apart and ride up and over the triangular shoulders. As the spring arms cross the apexes of the shoulders, the shutter moves quickly upward with a snap action, thereby blocking the optical path and providing tactile and audible feedback to the user.

DETAILED DESCRIPTION OF THE PREFERRED EMBODIMENT

An improved optical key switch assembly having particular application as part of a key in a keyboard is disclosed. In the following description, for purposes of explanation, specific numbers, dimensions, materials, etc. are set forth in order to provide a thorough understanding of the present invention. However, it will be apparent to one skilled in the art, that the present invention may be practiced without these specific details.

Figure 1:
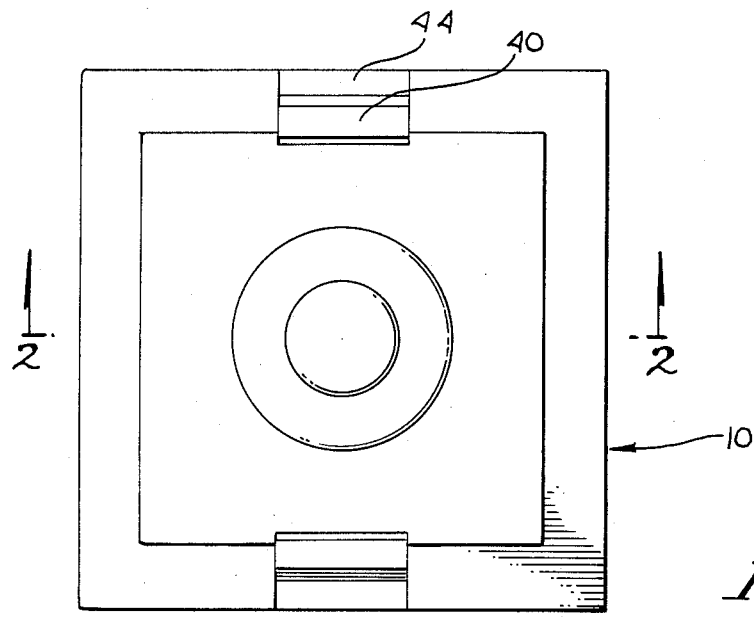
FIG. 1 is a top view of the switch of the present invention.

Referring to FIG. 1, a switch 10 is shown. It will be appreciated from the discussion which follows, that switch 10 is particularly adapted for use in keyboards, but that the switch may also be used in virtually any application requiring the use of a self contained modular momentary switch.

Figure 2:
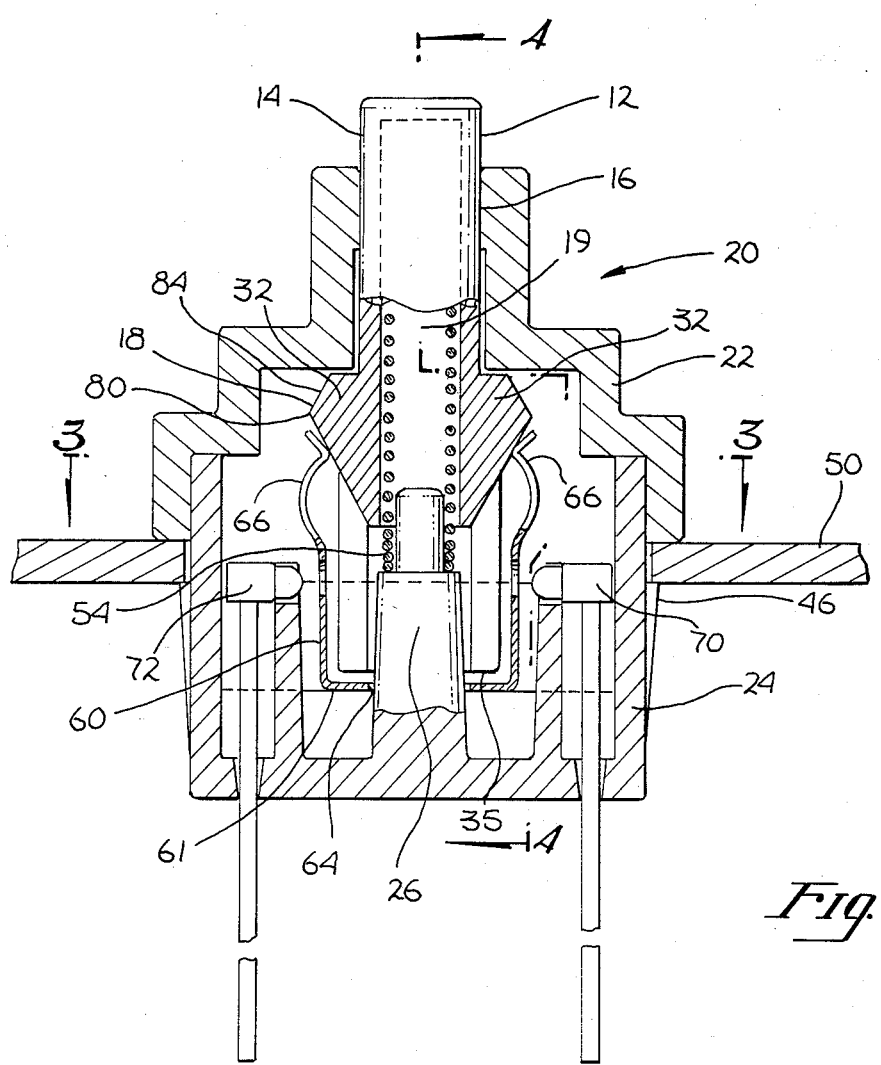
FIG. 2 is a sectional view of the present invention taken along line 2—2 of FIG. 1.

Referring now to FIG. 2, the actuating member of switch 10 is keystem 12. In actual use, a key cap (not shown) typically would be mounted on key stem 12 and be adapted to serve as one of a plurality of keys on a keyboard for actuation by an operator's fingers. Key stem 12 is slidably moveable longitudinally within switch housing 20.

Switch housing 20 is comprised of a cover cap 22 and body 24. Housing 20 may be constructed of any suitable opaque material such as a plastic or the like, unfilled polyester being the material used in the preferred embodiment.

Figure 3:
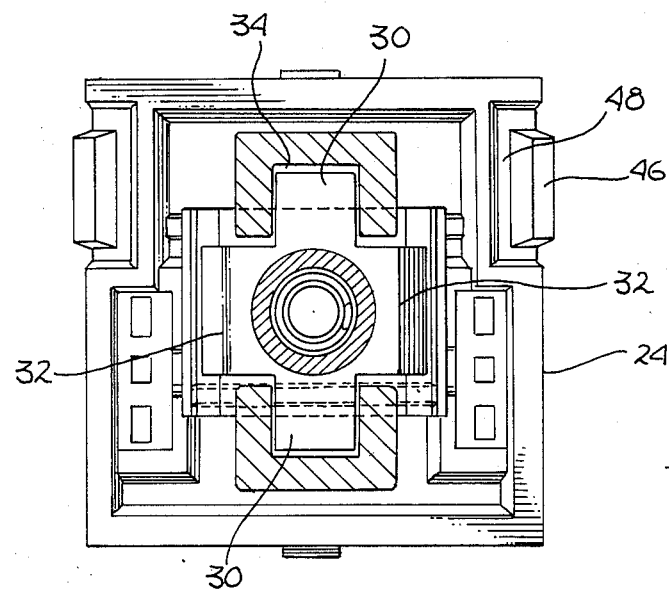
FIG. 3 is a sectional view of the present invention taken along line 3—3 of FIG. 2.

Key stem 12 has a generally cylindrical upper portion 14 which is adapted to permit key stem 12 to slide longitudinally within opening 16 in cover cap 22. As best shown in FIG. 3, lower portion 18 of key stem 12 includes rectangular lobes 30 and triangular shoulders 32 extending laterally from the axis of key stem 12. Lobes 30 and shoulders 32 are alternately disposed at 90 degree intervals about the axis of key stem 12. Rectangular lobes 30 of key stem 12 are adapted to slide longitudinally within open channels 34 molded into opposite walls of cover cap 22 thereby preventing key stem 12 from rotating within housing 20. Key stem 12 may be constructed of any suitable material, preferably one having a low coefficient of friction against the material of cover cap 22 and against the material of shutter 60. In the preferred embodiment, unfilled acetel is used.

Figure 4:
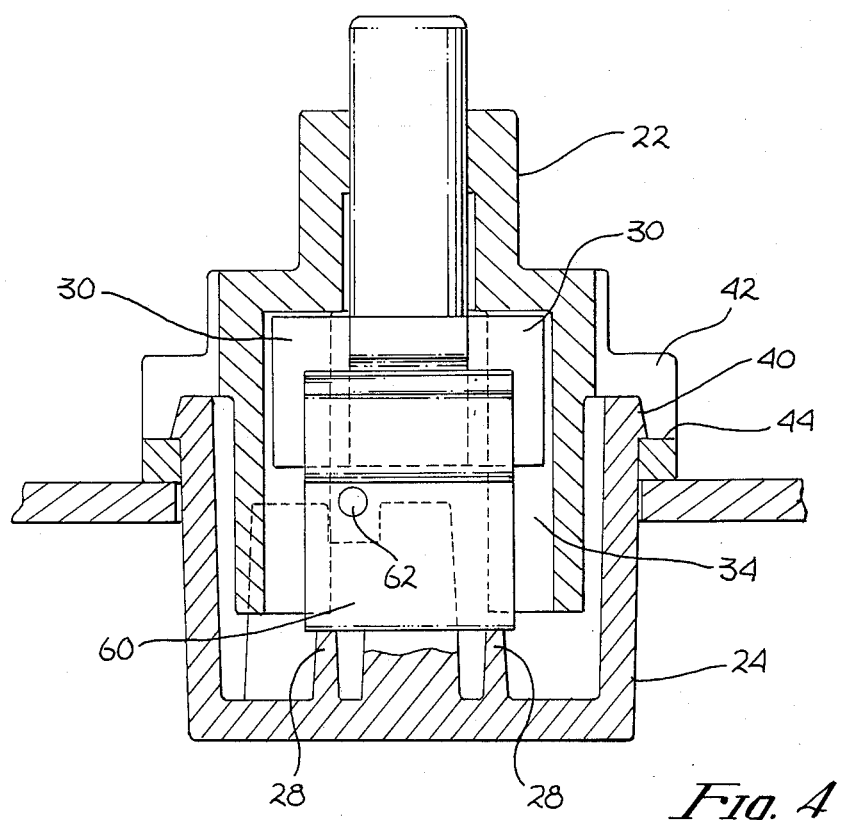
FIG. 4 is a sectional view of the present invention taken along line 4—4 of FIG. 2.

As best seen in FIGS. 1 and 4, cover cap 22 is retained on body 24 by ears 40 which protrude through openings 42 and capture surface 44 when cover cap 22 and body 24 are in an assembled configuration. Housing 20 is retained on a structural member such as chassis 50 by tabs 46 which extend laterally from body 24. When housing 20 is inserted through an appropriate hole in chassis 50, tabs 46 are initially forced within recesses 48. When cover cap 22 seats against chassis 50, tabs 46 spring outward, thereby retaining housing 20 on chassis 50.

Key stem 20 is supported in housing 20 by spring 54 which rests on post 26 of body 24. Spring 54 extends into cavity 19 of key stem 12, thereby allowing spring 54 to have a relatively long free length. Spring 54 is preferably stainless steel music wire of approximately 0.010 inch diameter. To provide satisfactory tactile feel, it is desirable that spring 54 exert approximately 6.5 ounces of force against key stem 12. A spring having approximately 30 active coils and a free length of approximately 1.14 inches has been found to provide the desired force.

Shutter 60 resides within housing 20 and normally rests upon ridges 28 of body 24 (See FIG. 4). Shutter 60 is preferably made of stainless steel, such as the alloy known as "302" and is preferably 0.0030–0.0033 inches thick. Shutter 60 is bent into a generally "U" shape having a generally flat lower segment 61 and two upwardly extending arms 66. A hole 64 in lower segment 61 of shutter 60 permits post 26 to extend through shutter 60 when the latter is resting on ridges 28.

Emitter 70 and detector 72 are disposed within body 24 at opposite sides thereof and offset from the center line thereof such that an optical line of sight exists between emitter 70 and detector 72 unobstructed by post 26. Emitter 70 is preferably a light emitting diode (LED) whose active wavelength is in the infrared region. However, LED's with different active wavelengths and other types of emitter devices may also be suitable. Detector 72 is a photosensitive device responsive to the active wavelength of emitter 70. In the presence of illumination of the wavelength to which detector 72 is sensitive, the electrical characteristics of the output of detector 72 are altered in a manner that can be detected by an external electrical circuit. Detector 72 may be a passive device, for example one whose electrical resistance varies as a function of illumination or it may be an active device which produces an electrical potential or switches an electrical current when illuminated. Detector 72 may be a phototransistor of the type which includes an integral Schmitt trigger. As used in the preferred embodiment, emitter 70 may be a type IRL-81 LED device manufactured by Seimens and detector 72 may be a type OPL-550 device manufactured by TRW. Shutter 60 contains apertures 62 which, when shutter 60 is resting on ridges 28, are aligned with the optical line of sight between emitter 70 and detector 72, designated by a broken line in FIG. 2.

Figures 5A, 5B:
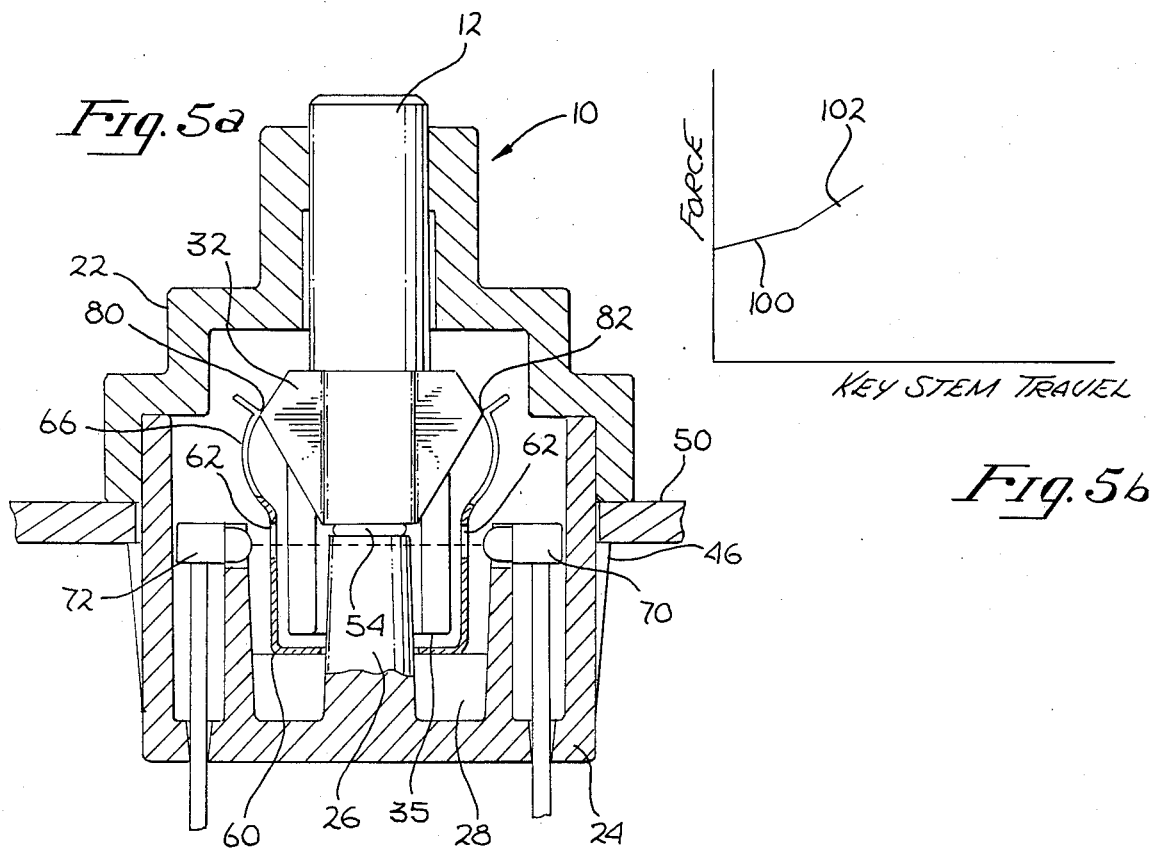
FIGS. 5a, 6a illustrate the operation of the present invention as it is activated by a user.
FIGS. 5b, 6b graphically illustrate force as a function of key stem travel as the present invention is operated.

To activate switch 10, key stem 12 is depressed in a downward direction. As key stem 12 travels downward, arms 66 of shutter 60 are forced outward by shoulders 32 of key stem 12. As the downward travel of key stem 12 progresses, ridges 82 of shutter 60 will eventually be in contact with apexes 80 of shoulders 32 as illustrated in FIG. 5a. A slight additional downward movement of key stem 12 will cause ridges 82 to pass beyond apexes 80 and ride in an upward direction on surfaces 84 of shoulders 32. Due to the energy stored in shutter 60 as a result of the spreading of flanges 66, shutter 60 travels quickly in an upwardly direction with a "snap" action. Upward travel of shutter 60 is limited by surface 35 at the lower end of channel 34. As shutter 60 springs upward and strikes surface 35 it emits an audible "click".

Figures 6A, 6B:
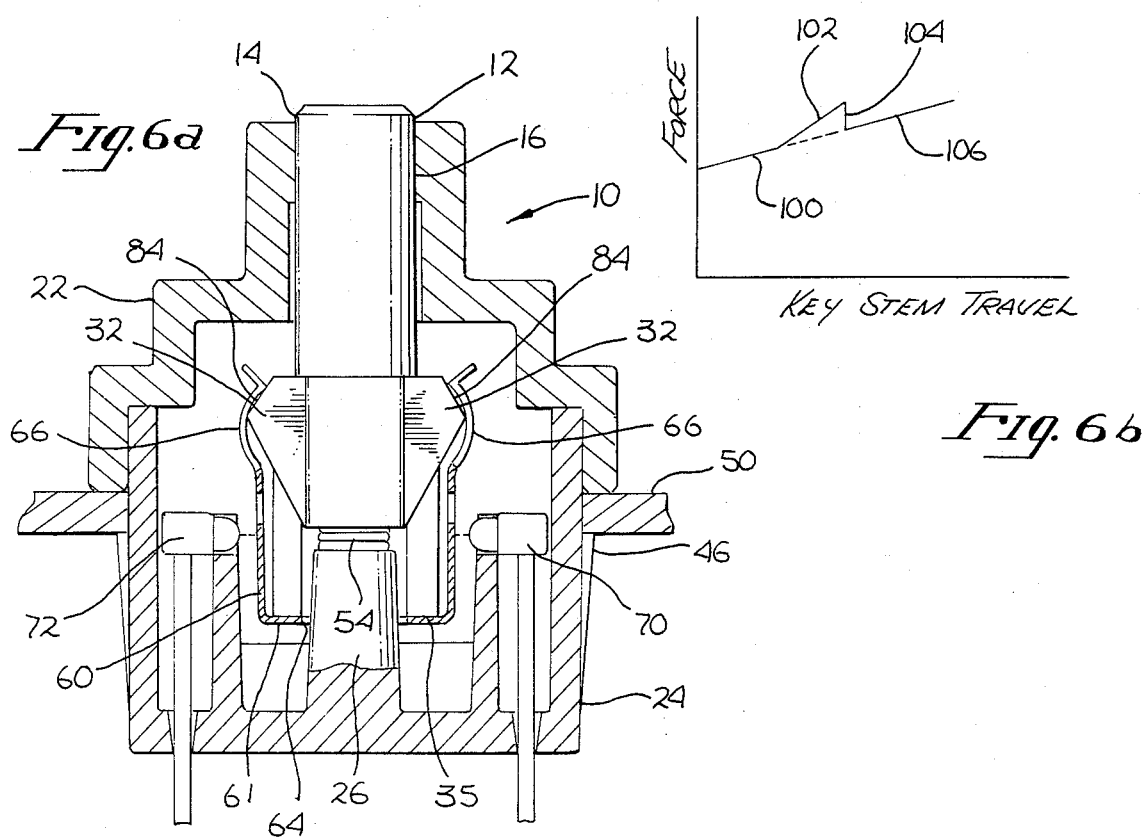

FIG. 6a illustrates switch 10 in its activated state. In this state, the optical path between emitter 70 and detector 72 is effectively blocked by shutter 60. It can be seen, therefore, that switch 10 operates as a "normally closed" type of switch in that detector 72 is illuminated at all times except when switch 10 is in an activated state. As can be seen in FIGS. 5a and 6a, switch 10 may also be configured as a "normally open" type of switch by relocating aperture 62 in shutter 60 so that the optical path between emitter 70 and detector 72 is blocked in the deactivated state and not blocked in the activated state.

Referring again to FIGS. 5 and 6, the operation of the present invention to provide the desired tactile and audible feedback to a user will be described. As key stem 12 is first depressed, the only resistance is that afforded by spring 54. As shown by line segment 100 in FIG. 5b, the force increases linearly as key stem 12 travels downward. When shoulders 32 first contact arms 66, there is an increase in resistive force as arms 66 are spread outward. This increase in force is illustrated by segment 102 of FIG. 5b. As soon as ridges 82 of arms 66 are above apex 80 of shoulder 32, shutter 60 will spring upward with an audible "click" as previously described. The increase in force contributed by the spreading of arms 66 is no longer present against key stem 12 and the only force is that contributed by spring 54. This decrease in force is illustrated by line segment 104 of FIG. 6b. This sudden reduction in the resistive force felt by a user's finger acting on key stem 12 provides tactile feedback to a user of switch 10.

It is important to note that it is the physical displacement of shutter 60 which provides this tactile and audible feedback. Therefore, the tactile and audible feedback is coincident with the interruption of the optical path between emitter 70 and detector 72. Consequently, it is impossible for a user to receive a "false cue" as can happen when tactile feedback is provided by means apart from the means for opening or closing the electrical circuit.

Further downward motion of key stem 12 to the limit of its travel is met only by the resistence of spring 54. This is illustrated by line segment 106 in FIG. 6b. Upon release of pressure applied to key stem 12 by a user, key stem 12 will be forced upward by spring 54. Upward motion of shutter 60 is limited by surfaces 35. During upward travel of key stem 12, shoulders 32 will again spread apart arms 66. As soon as ridges 82 are below apexes 80 of shoulders 32, shutter 60 will spring downward and come to rest against ridges 28 of body 24 with an audible "click". The spring action of shutter 60 will again cause a sudden decrease in the force exerted against key stem 12 when ridges 82 cross apexes 80, thereby providing tactile feedback to the user upon release of the switch 10.

Thus, an improved optical switch having particular applications to keyboards has been disclosed. The switch provides the high reliability inherent in an optical switch yet provides a user with tactile and audible feedback similar to that of a switch having mechanical contacts. Although the preferred embodiment of the invention has been described in detail, it is to be understood that various changes, substitutions and alterations can be made thereto without departing from the spirit and scope of the invention as disclosed above.

I claim:

1. An optical switch comprising:
   emitter means for emitting electromagnetic energy;
   detector means responsive to said energy emitted by said emitter means for producing an electrical output signal in response to said energy, said emitter means and detector means disposed at respective ends of an optical path;
a resilient shutter longitudinally moveable between said emitter means and detector means for selectively interrupting said optical path, said shutter having a first substantially relaxed position and a second substantially relaxed position; and
actuator means operable by a user and having a camming surface for operative engagement with said shutter such that operation of said actuator means causes said shutter to move between said first and second substantially relaxed positions with a snap action;
whereby said user receives tactile feedback coincident with said electrical output signal when said shutter moves between said first and second substantially relaxed positions.

2. The optical switch as defined by claim 1 further comprising stop means for limiting the motion of said shutter at said first and second positions such that an audible click is produced when said shutter contacts said stop means.

3. The optical switch as defined by claim 1 wherein said shutter has an aperture which is aligned with said optical path when said shutter is in said first substantially relaxed position and which is not aligned with said optical path when said shutter is in said second substantially relaxed position.

4. The optical switch as defined by claim 3 wherein said emitter means is a light emitting diode.

5. The optical switch as defined by claim 3 wherein said detector means is a phototransistor.

6. The optical switch as defined by claim 3 wherein said first position of said shutter corresponds to a deactivated condition of said switch and said second position of said shutter corresponds to an activated condition of said switch.

7. The optical switch as defined by claim 3 wherein said first position of said shutter corresponds to an activated condition of said switch and said second position of said shutter corresponds to a deactivated condition of said switch.

8. The optical switch as defined by claim 3 wherein said shutter comprises a deformable, generally U-shaped spring having a generally flat lower surface and two upwardly extending arms, each of said arms having a generally vertical lower portion, an outwardly protruding central portion and an outwardly flared upper portion, the junction of said central and upper portion defining an inwardly pointing ridge.

9. The optical switch as defined by claim 8 wherein said actuator means comprises a keystem having laterally opposed generally triangular shoulders on a lower portion thereof, and said camming surface comprises a lower sloped surface on each of said shoulders for engagement with said outwardly flared upper portion of said arms of said shutter so that downward motion of said keystem will cause said arms to spring outward, and an upper sloped surface on each of said shoulders upon which said ridge of said arms of said shutter slides upward as said arms spring inward.

10. An optical switch comprising:
a housing;
emitter means disposed within said housing for emitting electromagnetic energy;
detector means disposed within said housing responsive to said energy emitted by said emitter means for producing an electrical output signal in response to said energy, said emitter means and detector means disposed at respective ends of an optical path;
a resilient shutter disposed within said housing between said emitter means and detector means, said shutter being free to move longitudinally within said housing between a first substantially relaxed position and a second substantially relaxed position, said shutter having an aperture aligned with said optical path in said first substantially relaxed position, and not aligned with said optical path in said second substantially relaxed position; and
actuator means slideably mounted for longitudinal movement within said housing and having a camming surface for operative engagement with said shutter for causing said shutter to move between said first and second substantially relaxed positions with a snap action, thereby providing tactile feedback to a user.

11. The optical switch as defined by claim 10 further comprising stop means for limiting the motion of said shutter at said first and second positions such that an audible click is produced when said shutter contacts said stop means.

12. The optical switch as defined by claim 10 wherein said emitter means is a light emitting diode.

13. The optical switch as defined by claim 10 wherein said detector means is a phototransistor.

14. The optical switch as defined by claim 10 wherein said first position of said shutter corresponds to a deactivated condition of said switch and said second position of said shutter corresponds to an activated condition of said switch.

15. The optical switch as defined by claim 10 wherein said first position of said shutter corresponds to an activated condition of said switch and said second position of said shutter corresponds to a deactivated condition of said switch.

16. The optical switch as defined by claim 10 wherein said shutter has a generally flat lower surface and two upwardly extending arms, each of said arms having a generally vertical lower portion, an outwardly protruding central portion, an outwardly flared upper portion, the junction of said central and upper portion defining an inwardly pointing ridge.

17. The optical switch as defined by claim 16 wherein said actuator means comprises a keystem having laterally opposed generally triangular shoulders on a lower portion thereof, and said camming surface comprises a lower sloped surface on each of said shoulders for engagement with said outwardly flared upper portion of said arms of said shutter so that downward motion of said keystem will cause said arms to spring outward, and an upper sloped surface on each of said shoulders upon which said ridge of said arms of said shutter slides upward as said arms spring inward.

18. An optical switch comprising:
emitter means for emitting electromagnetic energy;
detector means responsive to said energy emitted by said emitter means for producing an electrical output signal in response to said energy, said emitter means and detector means disposed at respective ends of an optical path;
shutter means moveably disposed between said emitter means and detector means for selectively interrupting said optical path, said shutter means having a first position and a second position, said shutter means including spring means for causing said shutter means to move between said first and second positions with a snap action;

said shutter means comprising a deformable, generally U-shaped spring having a generally flat lower surface and two upwardly extending arms, each of said arms having a generally vertical lower portion, an outwardly protruding central portion and an outwardly flared upper portion, the junction of said central and upper portion defining an inwardly pointing ridge;

said shutter means having an aperture which is aligned with said optical path when said shutter means is in said first position and which is not aligned with said optical path when said shutter means is in said second position; and actuator means engageable with said shutter means and operable by a user for causing said shutter means to move between said first and second positions with said snap action;

whereby said user receives tactile feedback coincident with said electrical output signal when said shutter moves between said first and second positions.

19. The optical switch as defined by claim 18 wherein said actuator means comprises a keystem having laterally opposed generally triangular shoulders on a lower portion thereof, each of said shoulders having a lower sloped surface for engagement with said outwardly flared upper portion of said arms of said shutter so that downward motion of said keystem will cause said arms to spring outward, and each of said shoulders having an upper sloped surface upon which said ridge of said arms of said shutter may slide upward as said arms spring inward.

20. An optical switch comprising:
a housing;
emitter means disposed within said housing for emitting electromagnetic energy;
detector means disposed within said housing responsive to said energy emitted by said emitter means for producing an electrical output signal in response to said energy, said emitter means and detector means disposed at respective ends of an optical path;

a shutter comprising a deformable spring disposed within said housing between said emitter means and detector means, said shutter being free to move longitudinally within said housing between a first position and a second position, said shutter having an aperture aligned with said optical path in said first position, and not aligned with said optical path in said second position;

said shutter having a generally flat lower surface and two upwardly extending arms, each of said arms having a generally vertical lower portion, an outwardly protruding central portion, an outwardly flared upper portion, the junction of said central and upper portion defining an inwardly pointing ridge; and actuator means slideably mounted for longitudinal movement within said housing and engageable with said shutter for causing said shutter to move between said first and second positions with a snap action, thereby providing tactile feedback to a user.

21. The optical switch as defined by claim 20 wherein said actuator means comprises a keystem having laterally opposed generally triangular shoulders on a lower portion thereof, each of said shoulders having a lower sloped surface for engagement with said outwardly flared upper portion of said arms of said shutter so that downward motion of said keystem will cause said arms to spring outward, and each of said shoulders having an upper sloped surface upon which said ridge of said arms of said shutter may slide upward as said arms spring inward.

* * * * *